US011199599B2

(12) United States Patent
Guenter et al.

(10) Patent No.: US 11,199,599 B2
(45) Date of Patent: Dec. 14, 2021

(54) MAGNET ASSEMBLY COMPRISING CLOSED SUPERCONDUCTING HTS SHIMS (71) Applicant: Bruker BioSpin AG, Faellanden (CH)

(72) Inventors: Kenneth Guenter, Zurich (CH); Robert Schauwecker, Zurich (CH)

(73) Assignee: BRUKER SWITZERLAND AG, Faellanden (CH)

( * ) Notice: Subject to any disclaimer, the term of this patent is extended or adjusted under 35 U.S.C. 154(b) by 896 days.

(21) Appl. No.: 15/841,947

(22) Filed: Dec. 14, 2017

(65) Prior Publication Data
US 2018/0164388 A1 Jun. 14, 2018

(30) Foreign Application Priority Data

Dec. 14, 2016 (DE) .......................... 102016225017.5

(51) Int. Cl.
G01R 33/3815 (2006.01)
G01R 33/385 (2006.01)
(Continued)

(52) U.S. Cl.
CPC ..... G01R 33/3815 (2013.01); G01R 33/3856 (2013.01); G01R 33/3875 (2013.01);
(Continued)

(58) Field of Classification Search
CPC ............ G01R 33/3815; G01R 33/3856; G01R 33/3875; H01B 1/026; H01F 6/06; H01H 3/005
See application file for complete search history.

(56) References Cited

U.S. PATENT DOCUMENTS 8,384,387 B1 * 2/2013 Damadian .......... G01R 33/3806
324/319
8,604,793 B2 12/2013 Shen et al.
(Continued)

FOREIGN PATENT DOCUMENTS

CN 102456460 A 5/2012
CN 102483447 A 5/2012
(Continued)

OTHER PUBLICATIONS

S.B. Kim et al., Study on the magnetic field homogeneity of stacked HTS bulk magnets including the deteriorated HTS bulk by crack for compact NMR relaxometry, (IEEE Transactions on applied Superconductivity, vol. 26, issue 4, 2016, pp. 166-169.
(Continued)

Primary Examiner — Rishi R Patel
(74) Attorney, Agent, or Firm — Edell, Shapiro & Finnan LLC (57) ABSTRACT A magnet assembly in a magnetic resonance apparatus includes a cryostat and a superconducting main field magnet coil system arranged therein for generating a magnetic field in the direction of a z-axis in a working volume. The magnet assembly includes a shim device arranged inside the cryostat for adjusting the spatial variation or homogeneity of the magnetic field generated in the working volume by the magnet coil system. The shim device comprises at least one closed superconducting shim conductor path having an HTS layer. The HTS layer forms a surface that is geometrically developable such that unwrapping onto a plane changes the geodesic distance between any two points on the surface formed by the HTS layer by no more than 10%. The inner and/or outer contour of the geometrical development of the HTS layer describes a non-convex curve.

20 Claims, 8 Drawing Sheets (51) Int. Cl.
    *H01B 1/02*           (2006.01)
    *H01F 6/06*           (2006.01)
    *G01R 33/3875*     (2006.01)
    *H01H 3/00*           (2006.01)

(52) U.S. Cl.
    CPC .............. *H01B 1/026* (2013.01); *H01F 6/06* (2013.01); *H01H 3/005* (2013.01)

(56) References Cited

U.S. PATENT DOCUMENTS

| | | |
|---|---|---|
| 8,965,468 B2 | 2/2015 | Iwasa |
| 9,869,733 B2 | 1/2018 | Ma et al. |
| 10,641,845 B2 * | 5/2020 | Otake ................ G01R 33/3642 |
| 2006/0066429 A1 | 3/2006 | Kasten |
| 2011/0260727 A1 * | 10/2011 | Punchard ........... G01R 33/3875 324/318 |
| 2013/1002472 | 4/2013 | Iwasa |
| 2016/0131726 A1 * | 5/2016 | Hamada ............. G01R 33/3875 324/322 |

FOREIGN PATENT DOCUMENTS

| | | |
|---|---|---|
| CN | 104865544 A | 8/2015 |
| DE | 102011078592 A1 | 1/2013 |
| EP | 1902327 A1 | 3/2008 |
| FR | 2043465 A1 | 2/1971 |

OTHER PUBLICATIONS

Senatore et al., "Progresses and challenges in the development of high-field solenoidal magnets based on RE123 coated conductors", Superconductor Science and Technology, 27, (2014), 26 pages.

* cited by examiner

MAGNET ASSEMBLY COMPRISING CLOSED SUPERCONDUCTING HTS SHIMS

CROSS REFERENCE TO RELATED APPLICATIONS

This application claims foreign priority under 35 U.S.C. § 119(a)-(d) to German Application No. 10 2016 225 017.5 filed on Dec. 14, 2016, the entire contents of which are hereby incorporated into the present application by reference.

FIELD OF THE INVENTION

The invention relates to a magnet assembly in a magnetic resonance apparatus comprising a cryostat and a superconducting main field magnet coil system arranged therein for generating a magnetic field in the direction of a z-axis in a working volume arranged around the point z=0 on the z-axis. The magnet assembly also includes a shim device arranged inside the cryostat for adjusting the spatial variation or homogeneity of the magnetic field generated in the working volume by the main field magnet coil system. The shim device comprises at least one closed loop shim conductor path having a high temperature superconductor (HTS) layer. The superconducting shim conductor path has a winding number of 0 about the z-axis, i.e. it runs as many times clockwise around the z-axis as it does counterclockwise. The HTS layer forms a surface that is geometrically developable such that unwrapping it onto a plane changes the geodesic distance between any two points in the surface by no more than 10%.

BACKGROUND

Superconductors can carry electrical current with virtually no ohmic loss. These superconductors are especially useful for applications in which high electrical currents are required, e.g., in magnet coils.

The range of use of superconducting magnet systems includes various fields of application, in particular, magnetic resonance methods. A highly homogenous magnetic field in the sample volume helps to achieve high resolution in magnetic resonance methods. The basic homogeneity of the superconducting magnets can be optimized by the geometrical arrangement of the field-generating magnet coils.

Superconducting nuclear magnetic resonance (NMR) magnets are usually wound of NbTi or $Nb_3Sn$ wires. Due to the critical magnetic field of $Nb_3Sn$, the maximum achievable field strength is approximately 23.5 T. In NMR, this corresponds to a proton resonance frequency of 1000 MHz.

In order to achieve higher field strengths in Ultra-High Field (UHF) magnets, alternative conductor materials have to be used. In this connection, current research is primarily focused on the use of HTS strip conductors (e.g., rare earth-barium-copper oxides (ReBCO), bismuth-strontium-calcium-copper oxides (BSCCO), or iron pnictides). In this case, the UHF magnet is usually not produced entirely from HTS materials. Instead, for reasons of cost, it is advantageous to use HTS material only for the innermost coil sections, and to manufacture the background magnet using conventional low-temperature superconductor (LTS) technology (i.e., using NbTi and/or $Nb_3Sn$).

HTS strip conductors are also used in magnet systems operated at temperatures below 4.2 K (i.e., using liquid helium) at which LTS coils would not function. These include, in particular, cryogen-free magnet systems that are actively cooled by a cryocooler to temperatures of 10-80 K.

The z-component $B_z$ of the magnetic field can be expanded around the magnetic center at z=0 on the axis in the spherical harmonics (in cylindrical coordinates):

$$B_z(r, z, \varphi) = \sum_{n=0}^{\infty} \sum_{m=0}^{n} P_n^m\left(\frac{z}{\sqrt{r^2+z^2}}\right)(r^2+z^2)^{n/2}(A_{nm}\cos(m\varphi) + B_{nm}\sin(m\varphi))$$

where $P_n^m$ are the associated Legendre polynomials. The coefficients $A_{nm}$ and $B_{nm}$ are referred to as gradients or field gradients. As used in the above equation, n is the degree and m the order, of the Legendre polynomial $P_n^m$. Gradients with m=0 are referred to as on-axis gradients, and those with m≠0 are referred to as off-axis gradients. If all coefficients $A_{nm}$ and $B_{nm}$ vanish for 0<n<=k-1, the homogeneity is said to be of degree k. Theoretically this degree of homogeneity is achieved by a suitable design of the magnet assembly. However, due to unavoidable production-related imperfections, the actual field profile of a magnet assembly deviates from this ideal shape. In order to compensate for this deviation, so-called "shims" are provided in magnets for resonance spectroscopy.

The field strength of electrical shim coils can be adjusted using the electrical current. Superconducting shim coils are typically wound from NbTi conductors and consequently can be used only at very low temperatures and in relatively low magnetic fields where they do not lose their superconductive property. In contrast, shim coils which are wound from normally conductive material such as copper generate undesired heat in the cold environment of superconducting magnets as a result of their electrical resistance. Shims made of magnetic materials do not generate any heat since they influence the field distribution of the superconducting magnet only passively, but their field strength cannot be adjusted. This is a significant disadvantage compared with electrical shims.

Shims made of HTS are useful as adjustable shims in high magnetic fields or at high operating temperatures. This is, for instance, the case in the above-described UHF magnets in which the shims are preferably arranged radially inside the HTS coils, as otherwise their fields would be strongly shielded from the sample volume. A further example of application is in cryogen-free HTS magnets operated at temperatures at which LTS cannot be used.

In an orthogonal shim system, every shim generates a magnetic field whose mathematical expansion in the spherical harmonics comprises primarily only a single non-vanishing gradient. In practice, this means that, for each shim, the field variation in the working volume due to the relevant gradient is typically at least five times as large as the field variation due to the same gradient of every other shim.

Closed superconducting HTS shims have been implemented in similar magnet assemblies. However, typically each closed superconducting conductor path of a shim of this kind extends along the edge of a rectangular coated HTS film having an opening in the center, and is wrapped cylindrically around the volume to be corrected.

In general, the portions of a shim conductor path that are relevant for the field homogenization extend around the working volume mainly in the azimuthal direction with respect to the z-axis. Portions of the conductor path in the axial direction do not generate any axial field components and merely close the conductor path between the azimuthal portions.

The solutions currently deployed in the prior art have a number of disadvantages due to the rectangular and therefore convex shape of the shim conductor paths:

Specifically, a shim conductor path made from a rectangular film has just one of each portion in which the current flows in the positive or negative azimuthal direction, respectively. Therefore, in order to produce specific field distributions corresponding, for example, to an on-axis field gradient of high degree or to an off-axis gradient, shims having a plurality of mutually independent closed superconducting conductor paths are required. As a result, implementing a shim to produce a specific field distribution is generally rather complex. The rectangular geometry of the shim conductor paths makes mutual inductive decoupling extremely difficult or even impossible. For example, a shim conductor path can couple differently to the individual conductor paths of another shim. Consequently, the currents and the field distributions of one shim may unintentionally change when another shim is charged. Moreover, each closed superconducting conductor path of the shim requires a separate persistent switch or heater for changing its electrical current. This leads to a significant and undesired heat generation when charging the shim(s).

SUMMARY

The techniques presented herein modify a superconducting magnet coil assembly such that the limitations of typical superconducting magnet coil assemblies are significantly reduced or prevented as far as possible. Additionally, the techniques presented herein improve or adjust the field homogeneity of superconducting magnets with electrical shims (e.g., in high-field magnets with HTS insert coils, or HTS magnets at temperatures of 10-80 K).

In one example, a superconducting magnet coil assembly is characterized in that the inner and/or outer contour of the geometrical development of the surface formed by the HTS layer describes a non-convex curve.

Due to the non-convex shape, a shim conductor path of the magnet assembly may be designed such that it comprises a plurality of portions in the positive and/or negative azimuthal direction. Thus, a single closed superconducting shim conductor path can generate significantly more complex field distributions than a shim conductor path from the prior art. In particular, different shim conductor paths can be designed such that they are largely inductively decoupled from one another. This is advantageous in that these shims may be charged independently of one another, without the currents in other shim conductor paths changing in the process.

A further advantage of the magnet assembly described herein is the significantly lower number of closed superconducting conductor paths that are required for producing a particular field distribution. This also means that fewer superconducting switches are required to charge the shim with electrical current, and consequently less heat is generated in the cryostat.

In a first example of the magnet coil assembly, a shim conductor path generates a magnetic field which has an axial component $B_z(r, z, \varphi)$ with respect to a cylindrical coordinate system with a z-axis. The magnetic field, represented on the basis of the spherical harmonics about the point $z=0$ on the z-axis, primarily includes a single field gradient, in particular a field gradient corresponding to one of the spherical harmonics $z^2-r^2/2$, $z^3-3/2 \cdot zr^2$, $r \cdot \cos(\varphi)$, $r \cdot \sin(\varphi)$, $3rz \cdot \cos(\varphi)$, $3rz \cdot \sin(\varphi)$, $3r^2 \cdot \cos(2\varphi)$ or $3r^2 \cdot \sin(2\varphi)$, in addition to a non-vanishing field gradient of zero degree.

Using an orthogonal shim device comprising shim conductor paths according to the first example, adjusting the electrical current in corresponding shims may compensate for any field gradient of the main field magnet coil, without other field gradients being noticeably changed. Shims which produce field gradients corresponding to the spherical harmonics mentioned usually make it possible to sufficiently homogenize the initially non-homogenous field distribution of a magnet.

In a second example of the magnet coil assembly, a shim conductor path passes through two spaces that are separated from one another by a plane perpendicular to the z-axis. The magnetic fields generated, during operation, by the conductor portions that extend in the two spaces both have a z-component $B_z$ of the same sign at location $z=0$ on the z-axis. Shim conductor paths that extend in space in this way make it possible, for example, to produce a field gradient corresponding to the spherical harmonic $z^2-r^2/2$.

In a third example of the magnet coil assembly, a shim conductor path passes through an even number of spaces that are separated from one another by planes perpendicular to the z-axis. The magnetic fields generated, during operation, by the conductor portions that extend in each case in two adjacent spaces each have a z-component $B_z$ of the opposite sign at location $z=0$ on the z-axis. Shim conductor paths that extend in space in this way make it possible to produce on-axis field gradients corresponding to a spherical harmonic of odd degree, in particular to the functions z, $z^3-3/2 \cdot zr^2$ or $z^5-5r^2z^3+15/8 \cdot r^4z$. Moreover, shim conductor paths of this kind may be designed so as to be largely inductively decoupled from one another.

In a fourth example of the magnet coil assembly, a shim conductor path passes through four spaces that are separated from one another by a first plane that is perpendicular to the z-axis, and by a second plane that contains the z-axis. The magnetic fields generated, during operation, by the conductor portions that extend in each case in two spaces adjacent to one another on the first plane each have a z-component $B_z$ of the same sign at location $z=0$ on the z-axis. The magnetic fields generated, during operation, by the conductor portions that extend in each case in two spaces adjacent to one another on the second plane each have a z-component $B_z$ of opposite sign at location $z=0$ on the z-axis. Shim conductor paths that extend in space in this way make it possible to produce an off-axis field gradient corresponding to the spherical harmonic $r \cdot \cos(\varphi)$ or $r \cdot \sin(\varphi)$.

In a fifth example of the magnet coil assembly a shim conductor path passes through four spaces that are separated from one another by a first plane that is perpendicular to the z-axis, and by a second plane that contains the z-axis. The magnetic fields generated, during operation, by the conductor portions that extend in each case in two adjacent spaces each have a z-component $B_z$ of opposite sign at location $z=0$ on the z-axis. Shim conductor paths that extend in space in this way make it possible to produce an off-axis field gradient corresponding to the spherical harmonic $3rz \cdot \cos(\varphi)$ or $3rz \cdot \sin(\varphi)$.

In a sixth example of the magnet coil assembly, a shim conductor path passes through eight spaces that are separated from one another by a first plane that is perpendicular to the z-axis, and by a second and a third plane that contain the z-axis and are perpendicular to one another. The magnetic fields generated, during operation, by the conductor portions that extend in each case in two spaces adjacent to one another on the first plane each have a z-component $B_z$ of the same sign at location z=0 on the z-axis. The magnetic fields generated, during operation, by the conductor portions that extend in each case in two spaces adjacent to one another on the second or third plane each have a z-component $B_z$ of opposite sign at location z=0 on the z-axis. Shim conductor paths that extend in space in this way make it possible to produce an off-axis field gradient corresponding to the spherical harmonic $3r^2 \cdot \cos(2\varphi)$ or $3r^2 \cdot \sin(2\varphi)$.

The six individual examples described above may be implemented as alternatives, in part, but also in a supplementary manner or in combination.

A further example of the magnet coil assembly includes a shim conductor path that, when projected on a cylinder about the z-axis, comprises more than two conductor portions that extend in the azimuthal direction and are electrically interconnected by connecting portions extending in other directions. Shim conductor paths having this geometry are particularly suitable, for reasons of symmetry and available space, in cylindrically symmetrical main field magnet coil systems, for example, in solenoid magnets. Conductor portions in the azimuthal direction are relevant for homogenizing the main field magnet coil system, since these portions produce field components in the direction of the z-axis.

Further examples of the magnet coil assembly include a shim conductor path that is produced from an HTS strip conductor or from an HTS-coated film. The HTS material may include either ReBCO (rare earth metal (Re) combined with barium copper oxide (BCO)), in particular yttrium combined with BCO (YBCO) or gadolinium combined with BCO (GdBCO), or bismuth-strontium-calcium copper oxide (BSCCO). Closed superconducting, HTS-coated shim conductor paths can be particularly easily blanked, punched, laser-cut, etched or similarly produced from strip conductors or films. The HTS materials mentioned are particularly suitable as conductors for the magnet assemblies according to the invention, and can be produced in an appropriate form.

In other examples, the shim device comprises at least two closed superconducting shim conductor paths that are largely inductively decoupled from one another. In particular the mutual inductance $L_{12}$ between any two of the shim conductor paths is given by $|L_{12}|/\sqrt{L_1 L_2} \leq 0.2$, with $L_1$ and $L_2$ being the self-inductance of the two shim conductor paths. Inductively decoupled shim conductor paths can be charged independently of one another, without the current in the other shim conductor paths changing passively.

In further examples, a shim conductor path overlaps or intersects with itself when projected on a cylinder about the z-axis. In particular, the shim conductor path may be coiled cylindrically, in more than one layer, around the working volume, and/or such that the developable HTS layer exhibits at least one change in the direction of revolution about the z-axis. Multi-layer shim conductor paths allow more degrees of freedom during design and make it possible to produce more complex field distributions. Furthermore, a plurality of layers may be used to increase the efficiency of the conductor path (i.e., field strength per current). In some cases, changing the direction of revolution of the HTS layer about the z-axis can simplify, or even enable, inductive decoupling one shim conductor path from other shim conductor paths.

In further examples of the magnet assembly, the shim device comprises a plurality of closed superconducting shim conductor paths that are arranged so as to be radially above one another relative to the z-axis and extend axially and azimuthally in an identical manner. A set of shim conductor paths arranged in this way is more efficient than individual shim conductor paths, i.e., the set generates a greater field strength per current.

Examples of the magnet assembly in which a shim conductor path comprises a superconducting switch have also proven themselves in practice. When the superconducting switch is open, an electrical current may be introduced into the shim conductor path, and this current flows persistently in the closed superconducting shim conductor path after the switch has been closed.

Examples of the superconducting main field magnet coil system that comprise coils made of an HTS conductor and in which the main field magnet coil system and the shim device are cooled by a cryocooler to a temperature of between 10 K and 80 K, are also very advantageous in practice. Operating temperatures that are higher than the approximately 4 K necessary for using LTS material reduce the required cooling capacity. Operating temperatures of between 10 K and 80 K can be achieved by efficient cryocoolers. In this temperature range, it is necessary to use HTS materials for superconducting shims.

In further examples of the magnet assembly, a shim conductor path extends, with respect to the z-axis, radially inside the superconducting main field magnet coil system at least in part. Superconducting HTS shims that are radially inside the main field magnet coil system are more efficient and are significantly less shielded by the main field magnet coil system. In the case of very strong magnetic fields in this range, only active superconducting shims made of HTS are possible, since the current-carrying capacity of LTS would not be sufficient. This is the case, for example, in UHF magnet systems with HTS insert coils.

Finally, a magnetic resonance spectrometer comprising a magnet coil assembly of the type described herein also falls within the scope of the present invention.

BRIEF DESCRIPTION OF THE DRAWINGS

The invention is illustrated in the drawings and is explained in greater detail with reference to the drawings.

DETAILED DESCRIPTION

Figure 1:
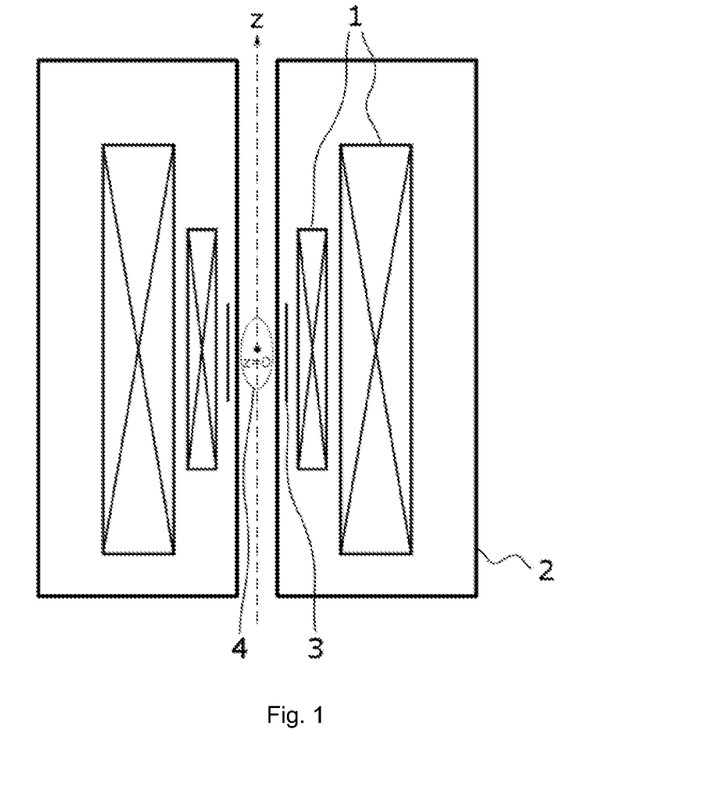
FIG. 1 is a schematic view of a magnet assembly according to an example of the invention in a magnetic resonance apparatus.

FIG. 1 schematically shows an example of the magnet assembly in a magnetic resonance apparatus. A main field magnet coil system 1 is arranged in a cryostat 2 and generates a magnetic field in the direction of a z-axis in a working volume 4 arranged around the point z=0 on the z-axis. A shim device 3 is arranged radially inside the main field magnet coil system 1 for adjusting the spatial variation or homogeneity of the magnetic field generated in the working volume 4 by the main field magnet coil system 1. The shim device 3 comprises at least one closed superconducting shim conductor path which has a winding number of 0 about the z-axis. In other words, the shim conductor path runs as many times clockwise around the z-axis as it does counterclockwise. The HTS layer of the shim conductor path forms a geometrically developable surface, the inner and/or outer contour of which describes a non-convex curve.

In order to produce a closed superconducting shim conductor path in the magnet assembly according to the invention, a closed conductor path may be blanked out of an HTS-coated film for example.

Figure 2A:
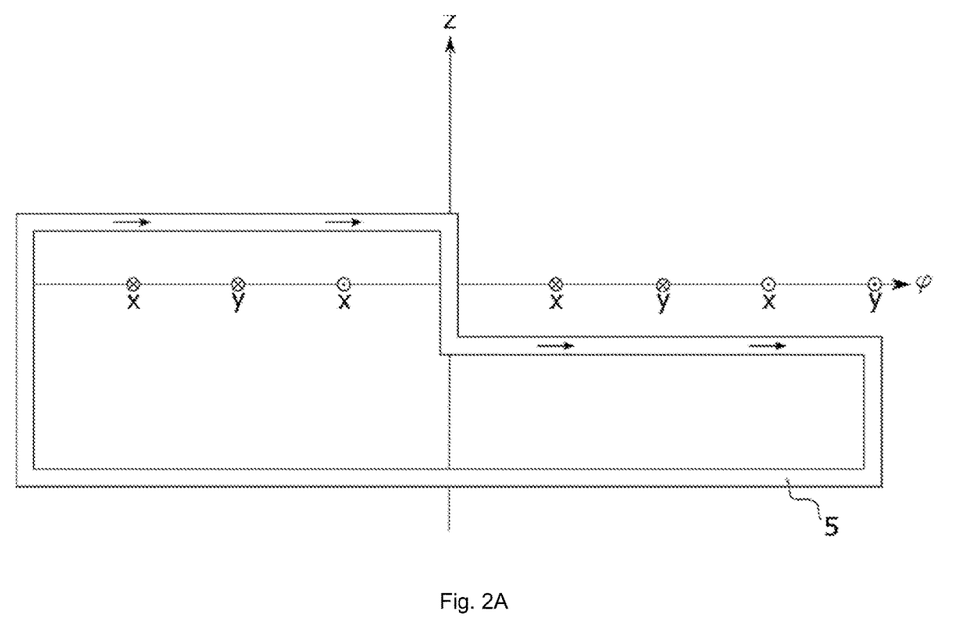
FIG. 2A is a schematic view of a shim conductor path for producing an on-axis field gradient corresponding to the spherical harmonic $z^2 - r^2/2$.
Figure 2B:
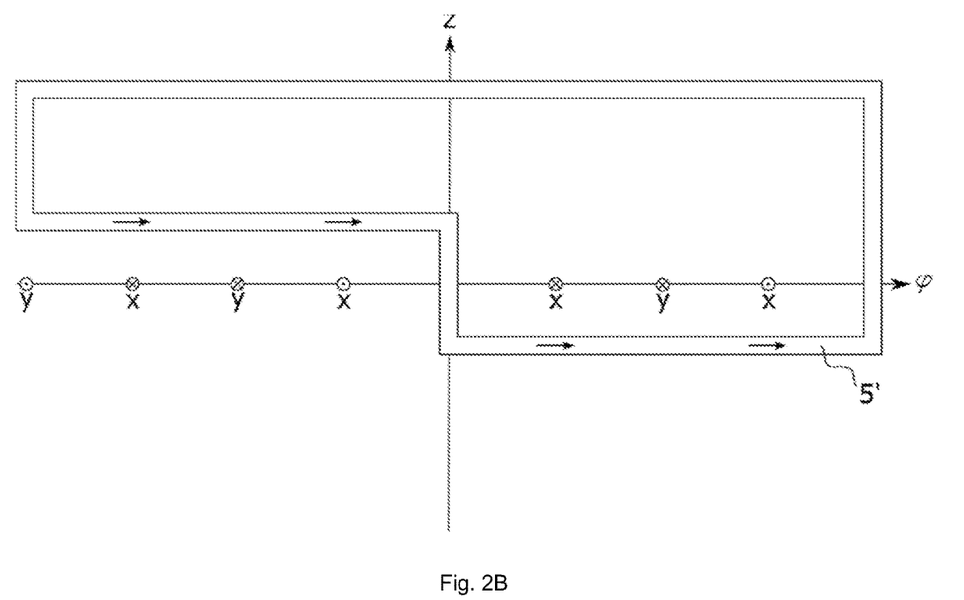
FIG. 2B is a schematic view of a shim conductor path for producing an on-axis field gradient corresponding to the spherical harmonic $z^2 - r^2/2$.

In order to produce particular field gradients, a shim conductor path of the magnet assembly may also be wound around the working volume 4 in a plurality of layers. FIG. 2A and FIG. 2B schematically show examples of shim conductor paths 5 and 5', respectively, that produce a field gradient corresponding to the spherical harmonic $z^2-r^2/2$ when the shim conductor paths are coiled cylindrically, in two layers, around the working volume 4 and carry an electrical current.

Figure 3:
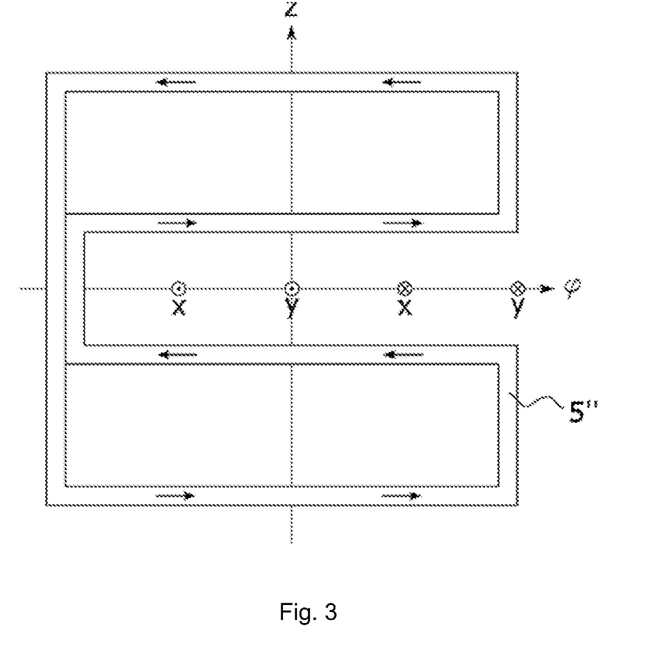
FIG. 3 is a schematic view of a shim conductor path for producing an on-axis field gradient corresponding to the spherical harmonic $z^3 - 3/2 \cdot zr^2$.

FIG. 3 shows, as an example, a shim conductor path 5" that has four azimuthally extending portions. The shim conductor path 5" essentially generates, in a working volume 4, a magnetic field having an on-axis field gradient corresponding to the spherical harmonic $z^3-3/2\cdot zr^2$ when the shim is coiled cylindrically around the working volume 4 and carries an electrical current. While a single closed superconducting conductor path comprising an HTS film is sufficient here, an analogous shim according to the prior art requires at least two rectangular closed superconducting conductor paths in order to produce a similar field distribution.

Figure 4A:
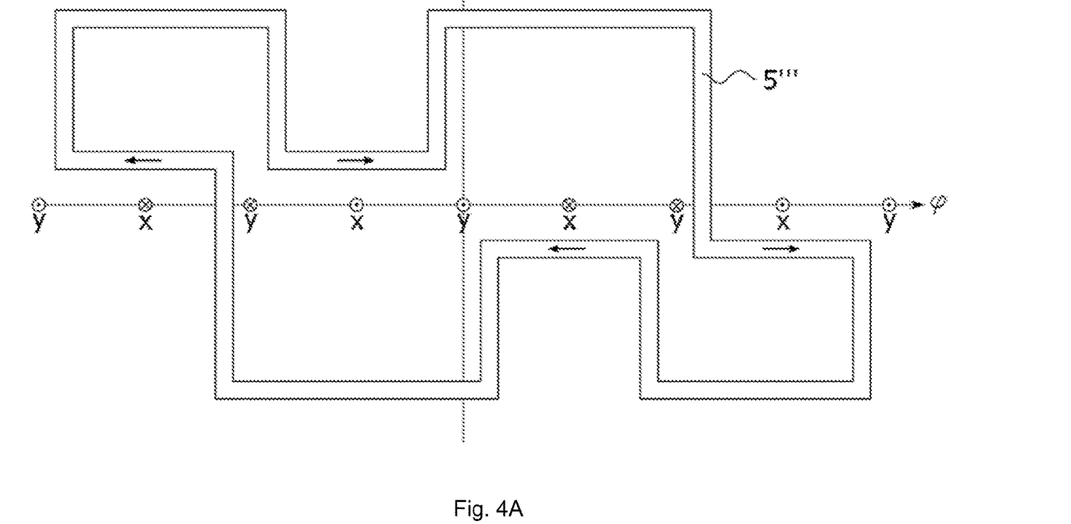
FIG. 4A is a schematic view of a shim conductor path for producing an off-axis field gradient corresponding to the spherical harmonic $r \cdot \sin(\varphi)$.
Figure 4B:
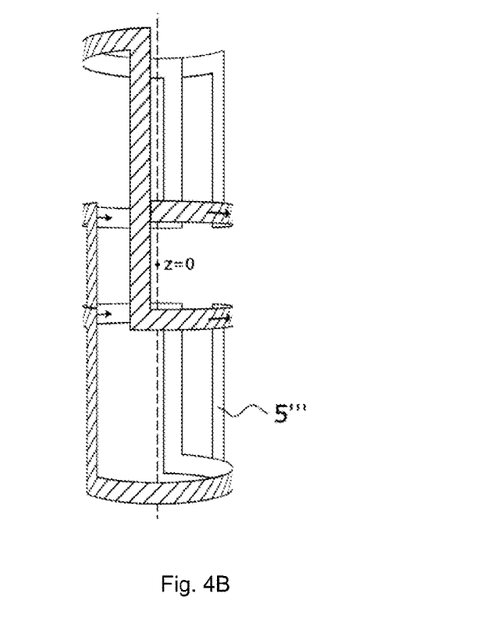
FIG. 4B is a three-dimensional view of the assembly according to FIG. 4A.
Figure 5A:
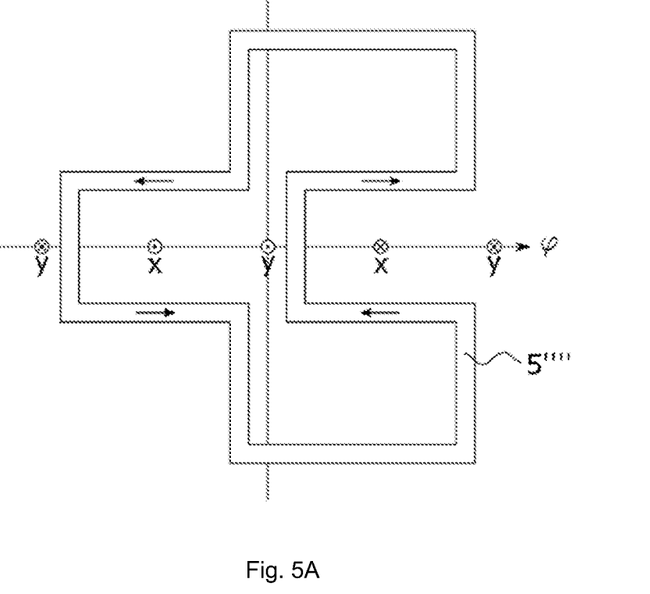
FIG. 5A is a schematic view of a shim conductor path for producing an off-axis field gradient corresponding to the spherical harmonic $3r \cdot z \cdot \sin(\varphi)$.
Figure 5B:
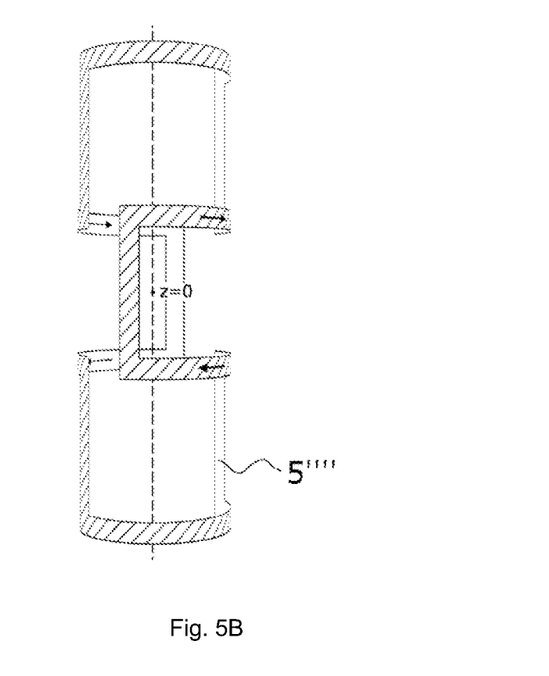
FIG. 5B is a three-dimensional view of the assembly according to FIG. 5A.
Figure 6:
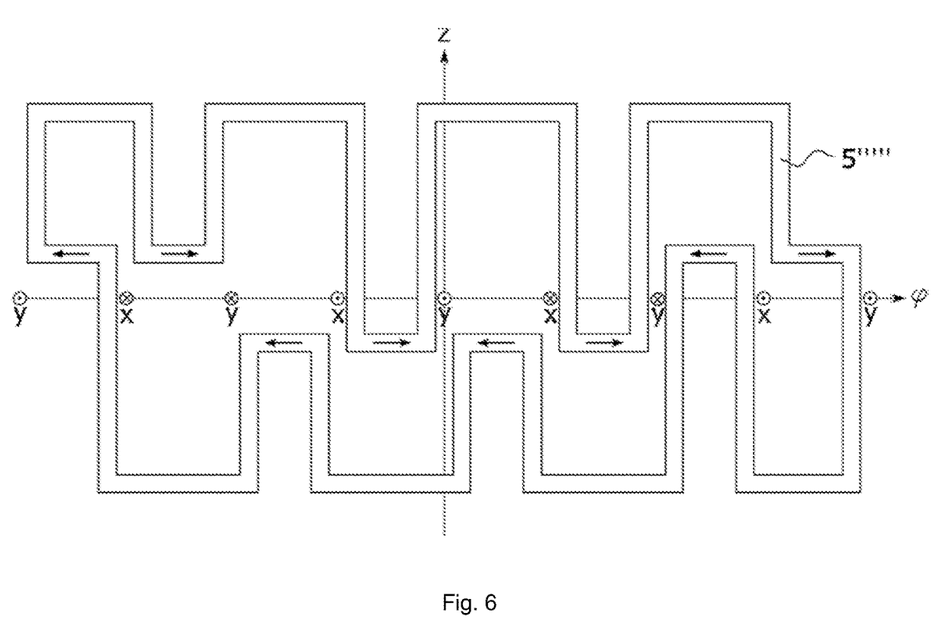
FIG. 6 is a schematic view of a shim conductor path for producing an off-axis field gradient corresponding to the spherical harmonic $3r^2 \cdot \cos(2\varphi)$.

The assembly according to the invention also comprises HTS shims for producing off-axis gradients, as shown, for example, in FIG. 4A, FIG. 4B, FIG. 5A, FIG. 5B, and FIG. 6. Due to the non-convex course of the geometrical development of the HTS layer (e.g., as depicted in FIG. 4A, FIG. 5A, and FIG. 6), it is possible to form shims of this kind each having a single closed superconducting conductor path 5''', 5'''' and 5'''''. FIG. 4A and FIG. 4B each show a conductor path 5''' for producing a field gradient corresponding to the spherical harmonic $r\cdot\sin(\varphi)$ when the shim conductor path 5''' is coiled cylindrically, in two layers, around the working volume 4 and carries an electrical current. FIG. 5A and FIG. 5B each show a shim conductor path 5'''' for producing a field gradient corresponding to the spherical harmonic $3r\cdot z\cdot\sin(\varphi)$ when the shim conductor path 5'''' is coiled cylindrically around the working volume 4 and carries an electrical current. FIG. 4B and FIG. 5B are three-dimensional views of the shim conductor paths of the corresponding FIG. 4A and FIG. 5A. The shim conductor path 5''''' in FIG. 6 is arranged cylindrically around the z-axis in two layers and produces a field gradient corresponding to the spherical harmonic $3r^2\cdot\cos(2\varphi)$ when the shim conductor path 5''''' carries an electrical current.

Figure 7A:
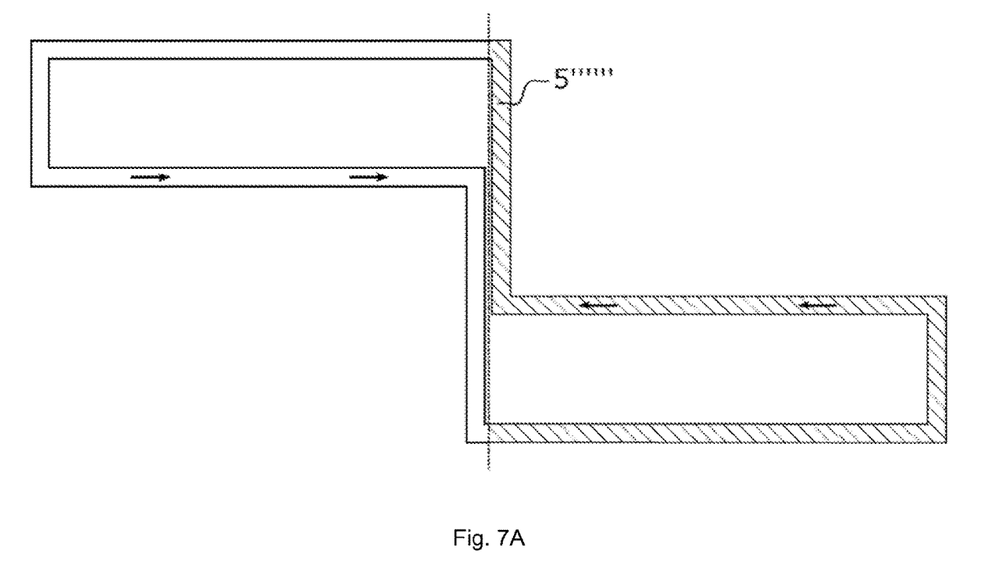
FIG. 7A is a schematic view of a shim conductor path for producing an on-axis field gradient corresponding to the spherical harmonic $z^2-r^2/2$.
Figure 7B:
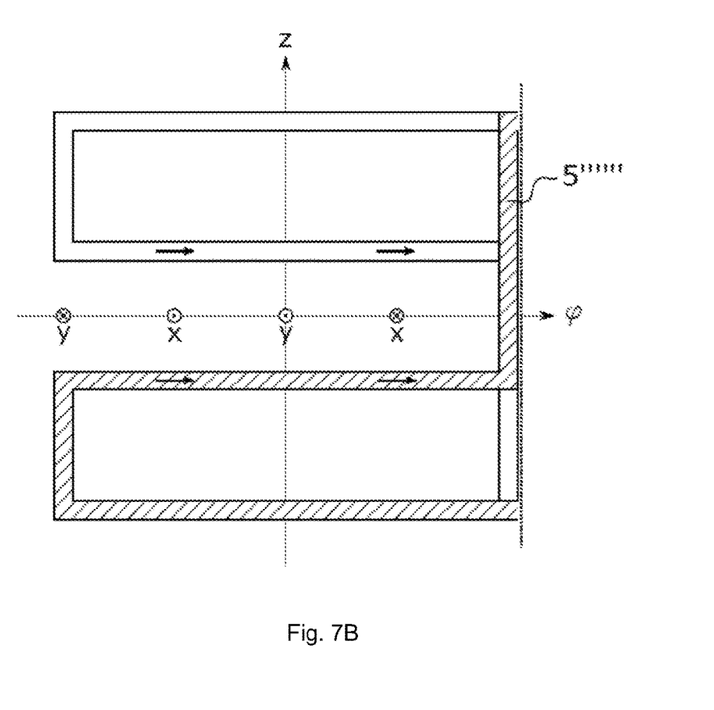
FIG. 7B shows the assembly according to FIG. 7A after it has been folded along the middle.

FIG. 7A and FIG. 7B show a shim conductor path 5''''' of a magnet assembly, in which the shim conductor path 5''''' overlaps with itself when projected on a cylinder. FIG. 7A shows the complete geometrical development of the conductor path 5''''' onto a plane, and FIG. 7B shows the conductor path 5''''' that has been folded or bent back in the middle, in the azimuthal direction, in the manner in which it is wound around the z-axis on a cylinder. In this way, in this example a shim having a field gradient corresponding to the spherical harmonic $z^2-r^2/2$ is achieved using a single symmetrical conductor path.

The two closed superconducting conductor paths 5 and 5' shown in FIG. 2A and FIG. 2B may also be used together, as a shim for producing a field gradient corresponding to the spherical harmonic $z^2-r^2/2$, for example. For reasons of symmetry, a shim of this kind does not produce field gradients corresponding to spherical harmonics of odd degree, and, simply on account of its shape, each of the two conductor paths 5 and 5' is largely inductively decoupled from shims that produce on-axis field gradients corresponding to spherical harmonics of odd degree.

In one example, the following geometry for the shim conductor path 5 on a constant radius of 35 mm around the working volume 4 is characterized: The two short azimuthally extending conductor portions of the conductor path 5 each have a z-coordinate of ±10 mm, and the long azimuthally extending conductor portion, which is wound twice around the working volume, has a z-coordinate of −36 mm. Furthermore, the width of the conductor path 5 is 4 mm. At a current of 100 A, the on-axis field gradients up to the $8^{th}$ degree at location z=0 on the z-axis amount to:

| gradient $A_{n0}$ | strength (G/cm$^n$) |
| --- | --- |
| $A_{00}$ | 19.7 |
| $A_{10}$ | 5.21 |
| $A_{20}$ | −3.38 |
| $A_{30}$ | 0.101 |
| $A_{40}$ | 0.0483 |
| $A_{50}$ | −0.0123 |
| $A_{60}$ | 0.0171 |
| $A_{70}$ | −0.000262 |
| $A_{80}$ | −0.00227 |

Apart from the homogenous field contribution $A_{00}$, the shim primarily produces a gradient $A_{10}$ corresponding to the spherical harmonic z, and a gradient $A_{20}$ corresponding to the spherical harmonic $z^2-r^2/2$. Because of the cylindrical symmetry of the shim, off-axis gradients do not occur.

A shim of this kind can be produced from a 50 mm-wide HTS-coated film. If even wider HTS-coated films are available, the long azimuthally extending conductor portion can be selected so as to be even further from z=0, in order to reduce the gradients of odd degree. Moreover, the inductive coupling to other shims can also be reduced in this way. If the long conductor portion is, for example, at z=−42 mm instead of at z=−36 mm, the coupling coefficient $|L_{12}|/\sqrt{L_1 L_2}$ to a z-shim reduces from 0.30 to 0.18. In this example, a single-layer conductor path having a rectangular development is assumed as the z-shim, the azimuthal conductor portions of which are located at z=±30 mm on a radius of 35 mm.

Next, a shim consisting of two conductor paths 5 and 5' will be considered. This shim, for reasons of symmetry, does not produce gradients of odd degree. The geometry is as follows: The two short azimuthally extending conductor portions of the shim conductor paths 5 and 5' each have a z-coordinate of ±10 mm, and the long azimuthally extending conductor portions have a z-coordinate of −36 mm or +36 mm. The width of the shim conductor paths 5 and 5' is again 4 mm. At a current of 100 A, the shim produces the following field gradients up to the $8^{th}$ degree:

| gradient $A_{n0}$ | strength (G/cm$^n$) |
|---|---|
| $A_{00}$ | 39.4 |
| $A_{20}$ | −6.76 |
| $A_{40}$ | 0.0968 |
| $A_{60}$ | 0.0342 |
| $A_{80}$ | −0.00453 |

Figure 8:
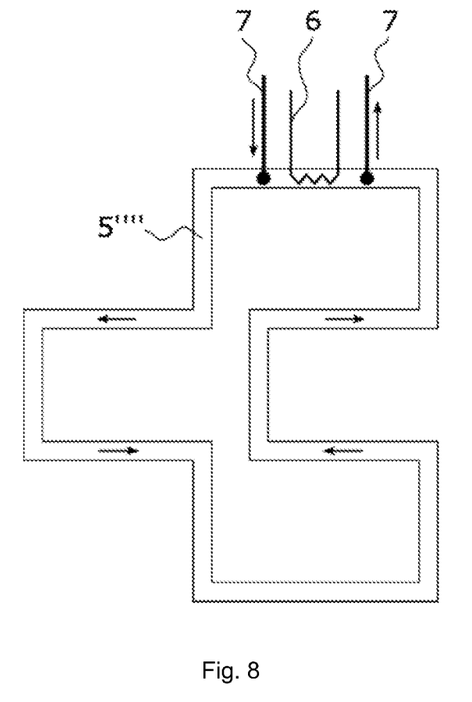
FIG. 8 is a schematic view of a shim conductor path comprising a superconducting switch and current leads.

FIG. 8 schematically shows, as an example, a shim conductor path 5"" of a magnet assembly comprising a superconducting switch 6. In order to charge the shim conductor path 5"" with an electrical current, the superconducting switch 6 can be opened, in that it is made to be normally conductive by heating, for example. The current may then be introduced into the conductor path 5"" via the current leads 7. After the superconducting switch 6 has been closed, the current flows persistently in the closed superconducting shim conductor path 5"", and the power supply via the current leads 7 may be turned off.

LIST OF REFERENCE SIGNS

1 main field magnet coil system
2 cryostat
3 shim device
4 working volume
5, 5', 5", 5'", 5"", 5""', 5""'' shim conductor path comprising an HTS layer
6 superconducting switch
7 current leads

What is claimed is:

1. A magnet assembly for a magnetic resonance apparatus comprising:
    a cryostat;
    a superconducting main field magnet coil system positioned in the cryostat for generating a magnetic field along a z-axis in a working volume centered around z=0 on the z-axis; and
    a shim device positioned inside the cryostat for adjusting a homogeneity of the magnetic field generated in the working volume by the main field magnet coil system, the shim device comprising a shim conductor path having a high temperature superconductor (HTS) layer in a single closed loop with a winding number of 0 about the z-axis wherein the HTS layer is geometrically developable such that unwrapping the HTS layer onto a plane changes the geodesic distance between any two points on the HTS layer by no more than 10%, and
    wherein an inner contour or an outer contour of the geometrical development of the HTS layer describes a non-convex curve.

2. The magnet assembly according to claim 1, wherein the single field gradient corresponds to one of the spherical harmonics $z^2-r^2/2$, $z^3-3/2 \cdot zr^2$, $r \cdot \cos(\varphi)$, $r \cdot \sin(\varphi)$, $3rz \cdot \cos(\varphi)$, $3rz \cdot \sin(\varphi)$, $3r^2 \cdot \cos(2\varphi)$ or $3r^2 \cdot \sin(2\varphi)$.

3. The magnet assembly according to claim 1, wherein the shim conductor path passes through two spaces that are separated from one another by a plane perpendicular to the z-axis, and wherein the magnetic fields generated by conductor portions that extend in the two spaces both having a z-component of the same sign at location z=0 on the z-axis.

4. The magnet assembly according to claim 1, wherein the shim conductor path passes through an even number of spaces separated from one another by planes perpendicular to the z-axis, and wherein the magnetic fields generated by conductor portions that extend in each case in two adjacent spaces each having a z-component of opposite sign at location z=0 on the z-axis.

5. The magnet assembly according to claim 1, wherein the shim conductor path passes through four spaces that are separated from one another by a first plane that is perpendicular to the z-axis and by a second plane that contains the z-axis, and wherein the magnetic fields generated by first conductor portions that extend in each case in two spaces adjacent to one another on the first plane each having a z-component of the same sign at location z=0 on the z-axis, and wherein the magnetic fields generated by second conductor portions that extend in each case in two spaces adjacent to one another on the second plane each having a z-component of opposite sign at location z=0 on the z-axis.

6. The magnet assembly according to any claim 1, wherein the shim conductor path passes through four spaces that are separated from one another by a first plane that is perpendicular to the z-axis and by a second plane that contains the z-axis, and wherein the magnetic fields generated by conductor portions that extend in each case in two adjacent spaces each having a z-component of opposite sign at location z=0 on the z-axis.

7. The magnet assembly according to claim 1, wherein the shim conductor path passes through eight spaces that are separated from one another by a first plane that is perpendicular to the z-axis and by a second plane and a third plane that contain the z-axis and are perpendicular to one another, and wherein the magnetic fields generated by first conductor portions that extend in each case in two spaces adjacent to one another on the first plane each having a z-component of the same sign at location z=0 on the z-axis, and wherein the magnetic fields generated by second conductor portions that extend in each case in two spaces adjacent to one another on the second plane or third plane each having a z-component of opposite sign at location z=0 on the z-axis.

8. The magnet assembly according to claim 1, wherein, when projected on a cylinder about the z-axis, the shim conductor path comprises more than two conductor portions that extend in an azimuthal direction and are electrically interconnected by connecting portions extending in other directions.

9. The magnet assembly according to claim 1, wherein the shim conductor path is produced from an HTS strip conductor or from an HTS-coated film, the HTS material comprising a rare earth metal-Barium-Copper oxide (ReBCO) or a Bismuth-Strontium-Calcium-Copper oxide (BSCCO).

10. The magnet assembly of claim 9, wherein the ReBCO comprises Yttrium-Barium-Copper oxide (YBCO) or Gadolinium-Barium-Copper oxide (GdBCO).

11. The magnet assembly according to claim 1, wherein the shim device comprises a plurality of shim conductor paths that are inductively decoupled from one another.

12. The magnet assembly according to claim 11, wherein the mutual inductance $L_{12}$ between any two of the shim conductor paths is given by $|L_{12}|/\sqrt{L_1 L_2} \leq 0.2$, $L_1$ and $L_2$ being the self-inductance of the two shim conductor paths.

13. The magnet assembly according to claim 1, wherein, when projected on a cylinder about the z-axis, the shim conductor path overlaps or intersects with itself.

14. The magnet assembly of claim 13, wherein the shim conductor path is coiled cylindrically, in more than one layer, around the working volume, or such that the geometrically developable HTS layer exhibits at least one change in direction of revolution about the z-axis.

15. The magnet assembly according to claim 1, wherein the shim device comprises a plurality of shim conductor paths that are arranged so as to be radially above one another relative to the z-axis and extend axially and azimuthally in an identical manner.

16. The magnet assembly according to claim 1, wherein the shim conductor path includes a superconducting switch.

17. The magnet assembly according to claim 1, wherein the superconducting main field magnet coil system comprises coils made of an HTS conductor, and wherein the superconducting main field magnet coil system and the shim device are cooled by a cryocooler to a temperature of between 10 K and 80 K.

18. The magnet assembly according to claim 1, wherein the shim conductor path extends, with respect to the z-axis, radially inside the superconducting main field magnet coil system at least in part.

19. An active shim device comprising:
a shim conductor path through a high temperature superconductor (HTS) layer in a single closed loop that is geometrically developable such that unwrapping the HTS layer onto a plane changes the geodesic distance between any two points on the HTS layer by no more than 10%,
wherein an inner contour or an outer contour of the geometrical development of the HTS layer describes a non-convex curve, and
wherein the shim conductor path generates a shimming magnetic field with an axial component $B_z(r, z, \varphi)$ with respect to a cylindrical coordinate system about a z-axis, the shimming magnetic field comprising primarily a single field gradient represented in a basis of spherical harmonics about $z=0$ on a z-axis of a magnetic field of a superconducting main field magnet coil system, in addition to a non-vanishing field gradient of zero degree.

20. The magnet assembly according to claim 1, wherein, the shim conductor path generates a shimming magnetic field with an axial component $B_z(r, z, \varphi)$ with respect to a cylindrical coordinate system about the z-axis, the shimming magnetic field comprising primarily a single field gradient represented in a basis of spherical harmonics about $z=0$, in addition to a non-vanishing field gradient of zero degree.

* * * * *